US012776622B2

(12) United States Patent
Mizutani et al.

(10) Patent No.: US 12,776,622 B2
(45) Date of Patent: Oct. 27, 2026

(54) OPTICAL MODULE, FREQUENCY VARIATION DETECTION METHOD, AND NON-TRANSITORY COMPUTER-READABLE STORAGE MEDIUM

(71) Applicant: NEC Corporation, Tokyo (JP)

(72) Inventors: Kenji Mizutani, Tokyo (JP); Masaki Oe, Tokyo (JP)

(73) Assignee: NEC CORPORATION, Tokyo (JP)

( * ) Notice: Subject to any disclaimer, the term of this patent is extended or adjusted under 35 U.S.C. 154(b) by 687 days.

(21) Appl. No.: 18/232,262

(22) Filed: Aug. 9, 2023

(65) Prior Publication Data

US 2024/0072516 A1 Feb. 29, 2024

(30) Foreign Application Priority Data

Aug. 25, 2022 (JP) ................................ 2022-133731

(51) Int. Cl.
*H01S 5/0687* (2006.01)
*H01S 5/00* (2006.01)

(52) U.S. Cl.
CPC .......... *H01S 5/0687* (2013.01); *H01S 5/0078* (2013.01)

(58) Field of Classification Search
CPC ..... H01S 5/0683; H01S 5/0687; H01S 5/0078
See application file for complete search history.

(56) References Cited

U.S. PATENT DOCUMENTS 6,915,035 B2 * 7/2005 Iwafuji ................ H04B 10/506 398/100
2010/0034224 A1 * 2/2010 Takabayashi ......... H01S 5/0687 372/20
2014/0369369 A1 * 12/2014 Tanaka .................. H01S 5/0687 372/20
2017/0353001 A1 * 12/2017 Takabayashi ......... H01S 5/1007
2018/0100967 A1 * 4/2018 Parker ................ G02B 6/12004
2018/0226767 A1 * 8/2018 Takabayashi ......... G01J 1/4257
(Continued)

FOREIGN PATENT DOCUMENTS

JP 2003-283044 A 10/2003
JP 2010-141090 A 6/2010
(Continued)

OTHER PUBLICATIONS

Japanese Office Action for JP Application No. 2022-133731, mailed on Aug. 4, 2026 with English Translation.

*Primary Examiner* — James A Menefee
(74) *Attorney, Agent, or Firm* — Sughrue Mion, PLLC

(57) ABSTRACT

In order to provide an optical module capable of detecting a frequency variation at higher accuracy, an optical module includes a light source that outputs light, a first splitter that splits the light, a band filter that transmits one piece of light split by the first splitter with a periodic frequency characteristic, a transmitted-light detector that detects transmitted-light intensity transmitted through the band filter, a variation device that varies the transmitted-light intensity in a first direction, by varying a parameter of a signal being input to the light source, and a frequency variation detection device that detects a frequency variation of the light from the light source, when a variation of the transmitted-light intensity in a second direction being opposite to the first direction is detected, in a case where the variation device varies the parameter from the first value to the second value.

10 Claims, 12 Drawing Sheets

(56) References Cited

U.S. PATENT DOCUMENTS

| | | | | |
|---|---|---|---|---|
| 2020/0028326 | A1 * | 1/2020 | Miura | H01S 5/06256 |
| 2024/0006847 | A1 * | 1/2024 | Kondo | H01S 3/1305 |

FOREIGN PATENT DOCUMENTS

| | | | |
|---|---|---|---|
| JP | 2015-060961 | A | 3/2015 |
| JP | 2016-086130 | A | 5/2016 |
| JP | 2017-183439 | A | 10/2017 |
| JP | 2020-136359 | A | 8/2020 |
| WO | 2018/146749 | A1 | 8/2018 |

* cited by examiner

OPTICAL MODULE, FREQUENCY VARIATION DETECTION METHOD, AND NON-TRANSITORY COMPUTER-READABLE STORAGE MEDIUM

This application is based upon and claims the benefit of priority from Japanese Patent Application No. 2022-133731, filed on Aug. 25, 2023, the disclosure of which is incorporated herein in its entirety by reference.

TECHNICAL FIELD

The present disclosure relates to an optical module, a frequency variation detection method, and a non-transitory computer-readable storage medium.

BACKGROUND ART

A frequency variable laser module for optical communication that uses a wavelength multiplexing technique is required to be variable in a wide wavelength band of a several terahertz standardized in International Telecommunication Union (ITU). Further, it is required to perform laser oscillation at high frequency-accuracy with respect to an oscillation frequency. As illustrated in FIG. 11, a light source 1000 of an external resonator-type in which a wide band filter 1006 can be built in is used for widening the band. Moreover, a frequency monitor optical circuit 1005 is built in the light source 1000 for compensating high frequency-accuracy. The frequency monitor optical circuit 1005 includes a function of monitoring the frequency and a function of fixing (locking) the frequency. FIG. 11 is a schematic diagram illustrating an example of basic configuration diagram of the light source 1000 being an integrated frequency variable laser. An external resonator is constituted of a semiconductor optical amplifier (SOA) 1001, a circuit 1002 for frequency selection, and optical reflection points 1003 and 1004. Further, the external resonator controls an oscillation frequency in the wide band filter including two ring filters having periods slightly different from each other. The light source 1000 includes the frequency monitor optical circuit 1005 outside the external resonator.

In general, a filter having a periodic frequency characteristic is used as the frequency monitor optical circuit 1005, and a ring filter 1007 having a frequency characteristic similar to that of the wide band filter 1006 is used in FIG. 11. An intensity ratio being an absolute value of output-light intensity/input-light intensity is used for eliminating wavelength dependency of the filter provided on the frequency monitor optical circuit 1005, and thus the filter on the frequency monitor optical circuit 1005 is controlled. The output-light intensity indicates intensity of light received by a photo diode (PD) 2. Further, the input-light intensity indicates intensity of light received by a PD 1. FIG. 12 is a diagram illustrating a characteristic of the filter. The horizontal axis in FIG. 12 indicates a frequency of light being output from the light source 1000, and the vertical axis in FIG. 12 indicates the intensity ratio of the received-light intensity of the PD2 to the received-light intensity of the PD1 in decibel representation.

For example, when light is oscillated at a frequency of 196,300 GHz, it is assumed that an intensity ratio of −0.8 dB associated with a position indicated by a point a in FIG. 12 is measured in advance. When the oscillation frequency is varied, the intensity ratio is varied according to the frequency characteristic. Thus, the frequency monitor optical circuit is capable of monitoring variation of the frequency, based on a variation amount between the intensity ratio after variation and the intensity ratio being initially measured. When a wavelength is fixed, the frequency monitor optical circuit 1005 performs control while changing a control parameter of the laser in such a way as to maintain the intensity ratio indicated by the point a in FIG. 12.

PTL 1 (Japanese Patent Application Laid-open Publication No. 2015-060961) discloses a wavelength control system that detects an output wavelength of a wavelength variable light source by detecting a ratio of an output of a first photodetector and an output of a second photodetector.

SUMMARY

As described above, in general, deviation of the oscillation frequency being varied gradually over time can be monitored by monitoring variation of the intensity ratio. However, when the light source includes a plurality of components, an unexpected wavelength skip may be caused due to a disturbance. In particular, in the light source 1000 in FIG. 11, the oscillation is easily varied to f±Δf (Δf: a periodic difference between two ring filters) in the vicinity of an oscillation frequency f. For example, as indicated by an arrow in FIG. 12, variation may be caused from a point b to a point c. When the intensity ratio is periodically varied, the frequency may be varied without varying the above-mentioned intensity ratio at the point b and the point c. In such a case, it is difficult to detect a frequency variation by the above-mentioned technique, and light having an erroneous frequency is generated in a communication system for a long time period, resulting in a failure of the communication system.

The present disclosure has been made in view of the above-mentioned problem, and an object of the present disclosure is to provide an optical module capable of detecting a frequency variation at higher accuracy.

In view of this, an optical module according to the present disclosure includes a light source configured to output light, a first splitting means for splitting the light, a band filter configured to transmit one piece of the light being split by the first splitting means with a periodic frequency characteristic, a transmitted-light detection means for detecting transmitted-light intensity being intensity of transmitted light being light transmitted through the band filter, a variation means for varying the transmitted-light intensity in a first direction being a positive direction or a negative direction, by varying a parameter of a signal being input to the light source from a first value to a second value, and a frequency variation detection means for detecting a frequency variation of the light being output from the light source, when a variation of the transmitted-light intensity in a second direction being opposite to the first direction is detected, in a case where the variation means varies the parameter from the first value to the second value.

Further, a frequency variation detection system according to the present disclosure includes a light source configured to output light, a first splitting means for splitting the light, a band filter configured to transmit one piece of the light being split by the first splitting means with a periodic frequency characteristic, a transmitted-light detection means for detecting transmitted-light intensity being intensity of transmitted light being light transmitted through the band filter, a variation means for varying the transmitted-light intensity in a first direction being a positive direction or a negative direction, by varying a parameter of a signal being input to the light source from a first value to a second value, and a frequency variation detection means for detecting a frequency variation of the light being output from the light source, when a variation of the transmitted-light intensity in a second direction being opposite to the first direction is detected, in a case where the variation means varies the parameter from the first value to the second value.

Further, a frequency variation detection method according to the present disclosure is a frequency variation detection method by an optical module including a light source configured to output light, a first splitting means for splitting the light, a band filter configured to transmit one piece of the light being split by the first splitting means with a periodic frequency characteristic, and a transmitted-light detection means for detecting transmitted-light intensity being intensity of transmitted light being light transmitted through the band filter, and includes varying the transmitted-light intensity in a first direction being a positive direction or a negative direction, by varying a parameter of a signal being input to the light source from a first value to a second value, and detecting a frequency variation of the light being output from the light source, when detecting a variation of the transmitted-light intensity in a second direction being opposite to the first direction, in a case of varying the parameter from the first value to the second value.

Further, a non-transitory computer-readable storage medium according to the present disclosure stores a frequency variation detection program. The frequency variation detection program is a frequency variation detection program in an optical module including a light source configured to output light, a first splitting means for splitting the light, a band filter configured to transmit one piece of the light being split by the first splitting means with a periodic frequency characteristic, and a transmitted-light detection means for detecting transmitted-light intensity being intensity of transmitted light being light transmitted through the band filter, and causes an information processing device to execute processing of varying the transmitted-light intensity in a first direction being a positive direction or a negative direction, by varying a parameter of a signal being input to the light source from a first value to a second value, and processing of detecting a frequency variation of the light being output from the light source, when detecting a variation of the transmitted-light intensity in a second direction being opposite to the first direction, in a case of varying the parameter from the first value to the second value.

BRIEF DESCRIPTION OF THE DRAWINGS

Exemplary features and advantages of the present disclosure will become apparent from the following detailed description when taken with the accompanying drawings in which:

FIG. 10 is a diagram illustrating an example of an information processing device that achieves the optical modules of the first example embodiment and the second example embodiment, and the like;

EXAMPLE EMBODIMENT

Next, a detailed explanation will be given for a first example embodiment with reference to the drawings.

First Example Embodiment

Figure 1:
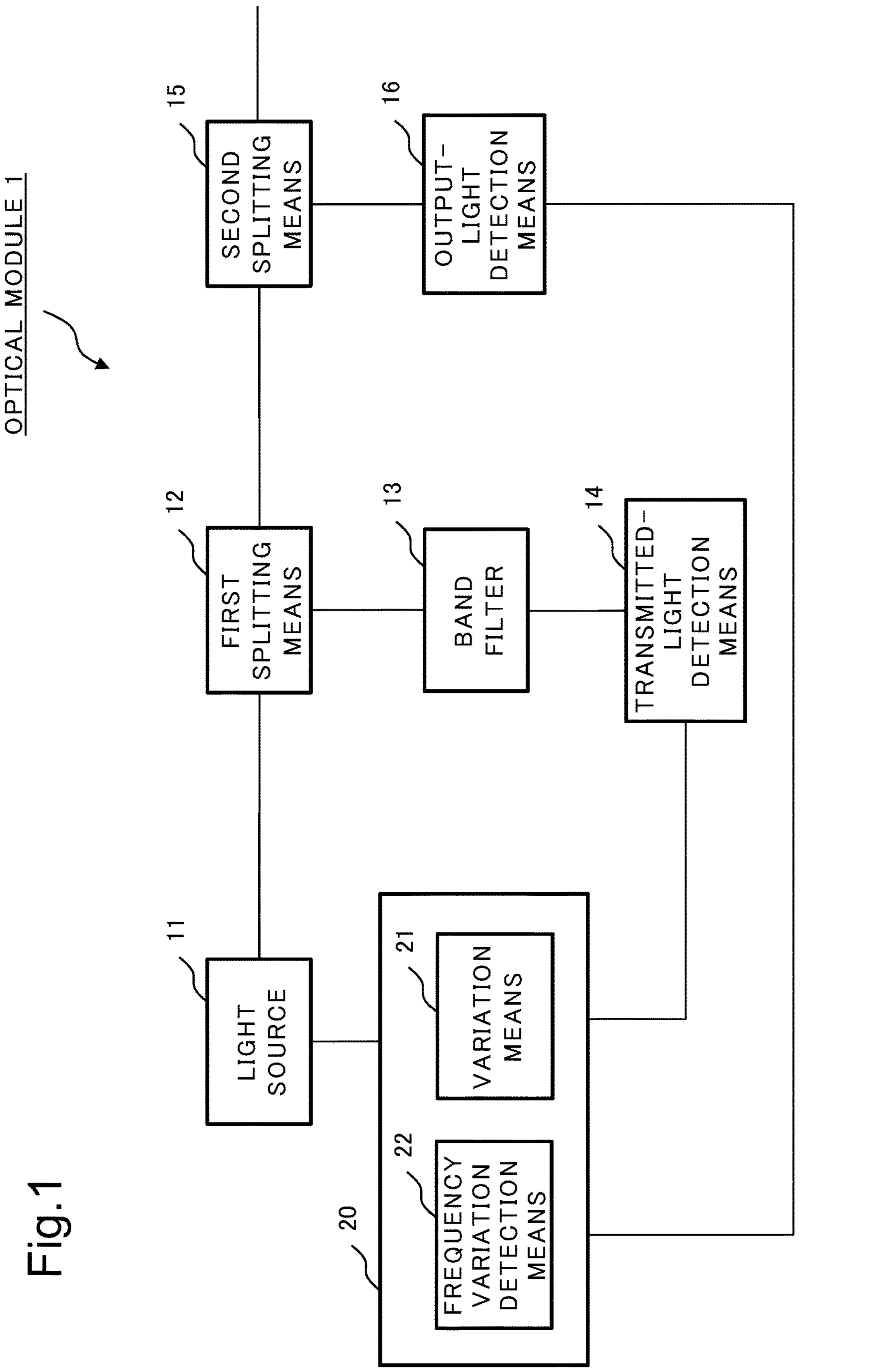
FIG. 1 is a block diagram illustrating a configuration example of an optical module of a first example embodiment.
Figure 2:
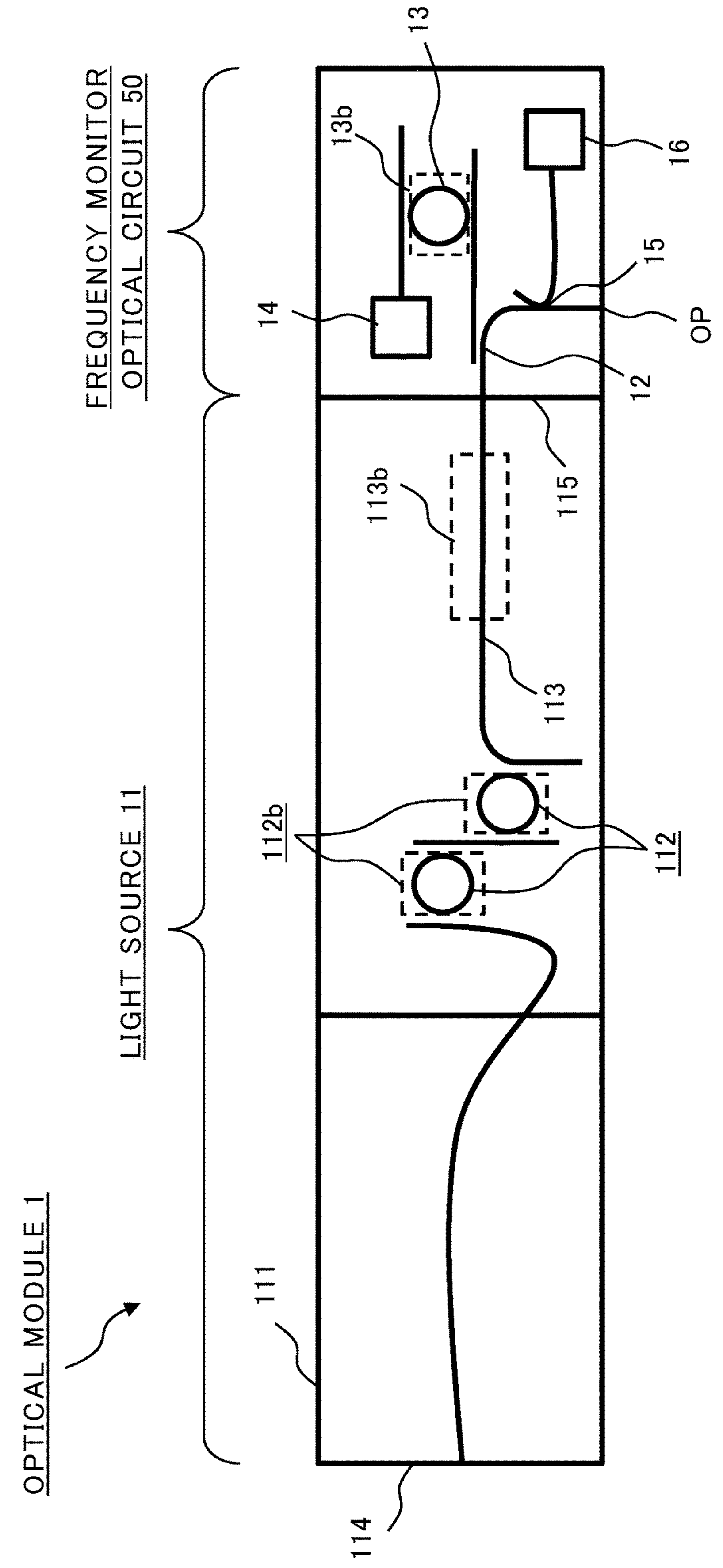
FIG. 2 is a diagram illustrating details of the optical module of the first example embodiment.

With reference to FIG. 1 and FIG. 2, an optical module 1 of a first example embodiment is described. FIG. 1 is a block diagram illustrating a configuration example of the optical module 1. FIG. 2 is a block diagram illustrating details of the optical module.

The configuration of the optical module 1 is described. As illustrated in FIG. 1, the optical module 1 includes a light source 11, a first splitting means 12, a band filter 13, a transmitted-light detection means 14, a second splitting means 15, an output-light detection means 16, and a control means 20. The control means 20 includes a varying means 21 and a frequency variation detection means 22.

The light source 11 outputs light. For example, the light source 11 is a laser. The light source 11 is electrically connected to the control means 20. Further, the light source 11 is optically connected to the first splitting means 12.

For example, the light source 11 includes a band filter configured by a ring resonator or the like. For example, an electric circuit provided to the optical module 1, which is not depicted, is capable of varying a temperature of the ring resonator of the light source 11 by varying a current applied to a heater arranged on each ring resonator. With this, a wavelength and a phase of light output from the light source 11 are adjusted.

The first splitting means 12 is optically connected to the light source 11, the band filter 13, and the second splitting means 15. The first splitting means 12 splits the light output from the light source 11. For example, the first splitting means 12 is an optical splitter.

The first splitting means 12 splits the light output from the light source 11 into at least two parts, and outputs one piece of the split light to the band filter 13. Further, the first splitting means 12 outputs the other part of the split light to the second splitting means 15.

The band filter 13 is optically connected to the first splitting means and the transmitted-light detection means 14. The band filter 13 transmits the one piece of the light split by the first splitting means 12. For example, the band filter 13 is a ring resonator. The band filter 13 is an optical filter having periodic transmission characteristics. Preferably, deviation of the frequency of the light output from the optical module 1 can be monitored at a higher accuracy by using a slope part at which intensity of the light transmitted through the band filter 13 is largely varied with respect to a variation of the frequency of the light output from the light source 11. The relationship between the wavelength of the light transmitted through the band filter 13 and the frequency of the light output from the light source 11 may be another relationship.

The transmitted-light detection means 14 is optically connected to the band filter 13. Further, the transmitted-light detection means 14 is electrically connected to the control means 20. The transmitted-light detection means 14 detects transmitted-light intensity being intensity of the transmitted light which is the light transmitted through the band filter 13. For example, the transmitted-light detection means 14 is a photodiode.

The transmitted-light detection means 14 receives the light transmitted through the band filter 13, and generates an electric signal by photoelectric conversion. With this, the transmitted-light detection means 14 detects the transmitted-light intensity. The transmitted-light detection means 14 outputs the transmitted-light intensity to the control means 20.

The second splitting means 15 is optically connected to the first splitting means 12 and the output-light detection means 16. Further, the second splitting means 15 is optically connected to an optical modulator (not depicted in FIG. 1) provided outside the optical module 1 or the like. The second splitting means 15 splits the other part of the light split by the first splitting means 12. For example, the second splitting means 15 is an optical splitter.

The second splitting means 15 splits the light output from the first splitting means 12 into at least two parts, and outputs one piece of the split light to the output-light detection means 16. Further, the second splitting means 15 outputs the other part of the split light to the outside of the optical module 1. The light output to the outside of the optical module 1 is modulated by an optical modulator or the like, which is not depicted, and is output to a device on the reception side.

The output-light detection means 16 is optically connected to the second splitting means 15. Further, the output-light detection means 16 is optically connected to the control means 20. The output-light detection means 16 detects output-light intensity being intensity of the output light being the one piece of the light split by the second splitting means. For example, the output-light detection means 16 is a photodiode.

The output-light detection means 16 receives the light split by the second splitting means 15, and generates an electric signal by photoelectric conversion. With this, the output-light detection means 16 detects the output-light intensity. The output-light detection means 16 outputs the output-light intensity to the control means 20.

Next, with reference to FIG. 2, details of the light source 11, the first splitting means 12, the band filter 13, the transmitted-light detection means 14, the second splitting means 15, and the output-light detection means 16 are described. FIG. 2 is a specific representation of FIG. 1. In FIG. 2, the control means 20 is not depicted. As illustrated in FIG. 2, the optical module 1 includes the light source 11 and a frequency monitor optical circuit 50. As illustrated in FIG. 2, the frequency monitor optical circuit includes the first splitting means 12, the band filter 13, the transmitted-light detection means 14, the second splitting means 15, and the output-light detection means 16.

As illustrated in FIG. 2, the light source 11 includes an SOA 111, a band filter 112, a phase control unit 113, a first reflection means 114, and a second reflection means 115. Further, the band filter 112 includes a heater electrode 112*b*. The phase control unit 113 includes a heater electrode 113*b*. The first reflection means 114 is a total reflection mirror. Further, the second reflection means 115 is a semi-transmissive mirror that reflects a part of incident light and transmits another part thereof.

The SOA 111 outputs an amplified spontaneous emission (ASE) light having a wide band, according to an excitation current input from the outside. The light output from the SOA 111 is amplified by repeating reflection between the first reflection means 114 and the second reflection means 115, and is output through an output port OP from the second reflection means 115 to the outside of the optical module 1 via the frequency monitor optical circuit 50.

In this state, reflection is repeated from the SOA 111 via the band filter 112 that transmits only a predetermined wavelength, and hence the oscillation frequency of the light output from the second reflection means is determined by the band filter 112. As illustrated in FIG. 2, the band filter 112 is configured by two ring resonators. The wavelength of the light transmitted through the band filter 112 is adjusted by power supplied to the heater electrode 112*b* arranged on each of the ring resonators.

Further, a transmission peak of an external resonator of the light source 11 is adjusted by the phase control unit 113, and the light output from the second reflection means 115 is output in a state in which the transmission peak matches with that of the band filter 112. The phase control unit 113 is an optical waveguide capable of varying a refraction index of the optical waveguide according to a current and a voltage from the outside or power. For example, the heater electrode 113*b* for phase adjustment is arranged in the optical waveguide, and the phase control unit 113 is capable of adjusting a phase of the external resonator by varying the refraction index according to applied power and varying the optical path length.

In the frequency monitor optical circuit 50, in the example illustrated in FIG. 2, the first splitting means 12, the band filter 13, the transmitted-light detection means 14, the second splitting means 15, and the output-light detection means 16 also include configurations, functions, and connection relationships similar to those in the description given above.

The control means 20 is described. As illustrated in FIG. 1, the control means 20 includes the varying means 21 and the frequency variation detection means 22. The control means 20 is electrically connected to the light source 11, the transmitted-light detection means 14, and the output-light detection means 16.

The varying means 21 varies a parameter of a signal input to the light source 11. Specifically, the signal input to the light source 11 is an electric signal input to the light source 11. The parameter of the signal may be any one of power, a current, and a voltage of the electric signal.

More specifically, the varying means 21 continuously varies the parameter within a first range with respect to a reference value of phase power input to the phase control unit 113 described above. For example, the reference value is a value of the phase power directly before the variation within the first range. It is assumed that, in advance, the varying means 21 stores an upper limit value and a lower limit value of the first range for the variation with respect to the phase power value during operation. The varying means 21 varies the phase power by a unit amount for every unit time between the upper limit value and the lower limit value. The unit amount is also referred to as a variation amount in the description given below. The unit time indicates a few milliseconds, for example, two milliseconds or three milliseconds. Further, the unit amount is 20 μW, for example. For example, the varying means 21 continuously increases the value of the phase power by the unit amount within the first range, and reduces the phase power by the unit amount when the value of the phase power reaches the upper limit value. Further, for example, the varying means 21 continuously reduces the value of the phase power by the unit amount within the first range, and increases the phase power by the unit amount when the value of the phase power reaches the lower limit value.

Figure 3:
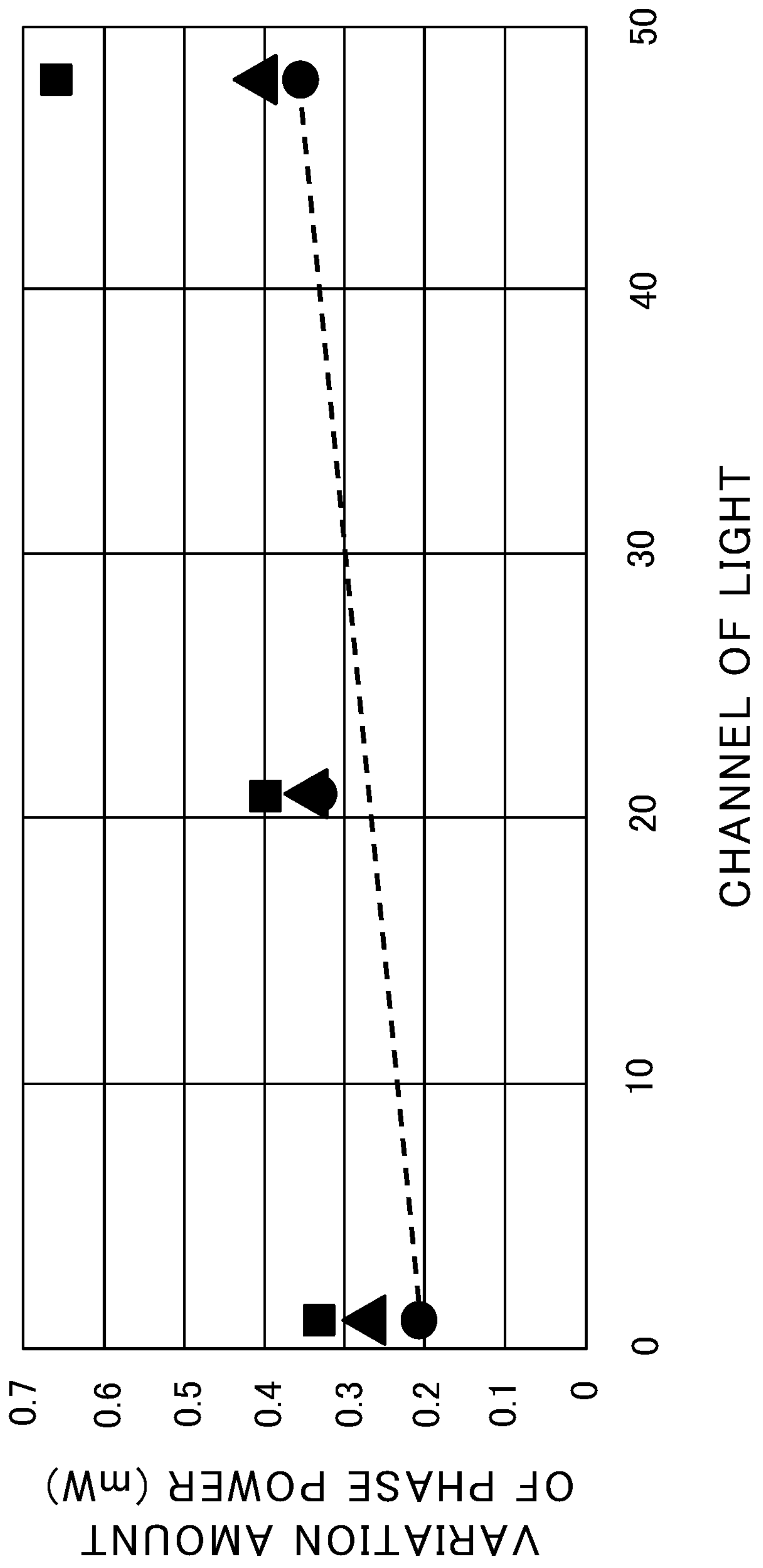
FIG. 3 is a diagram illustrating characteristics of the optical module of the first example embodiment.

The unit time and the unit amount are not limited to the above-mentioned examples. Further, the unit amount may be varied based on at least one of a temperature of a case of the optical module 1 and the frequency of the light output from the light source 11. With reference to FIG. 3, description is made on a relationship between the temperature of the case and the channel of the light with respect to the variation amount of the phase power.

FIG. 3 is a diagram illustrating characteristics of the optical module 1. In FIG. 3, the horizontal axis indicates the channel of the light output from the light source 11. Further, the vertical axis indicates the variation amount of the phase power required for varying the oscillation frequency by a certain amount. For example, the channel of the light in FIG. 3 is associated with a channel specified by ITU. In FIG. 3, the circle, the triangle, and the square indicate variation amounts of the phase power when temperatures of the case are different form one another. For example, the circle indicates a relationship between the channel of the light and the phase power when the temperature of the case is −20 degrees Celsius. For example, the circle positioned on the left side in FIG. 3 indicates that the variation amount of the phase power for the unit time is 0.2 mW when the temperature of the case is −20 degrees Celsius and the channel of the light output from the light source 11 is one.

The frequency variation detection means 22 detects a ratio of the transmitted-light intensity detected by the transmitted-light detection means 14 and the output-light intensity detected by the output-light detection means 16. Because the ratio of the output-light intensity is acquired, there is no need to consider a difference of the optical output intensity from the light source 11 between oscillation frequencies. Further, as described above, the varying means 21 varies the parameter of the phase power input to the light source 11 within the first range. The oscillation frequency is varied along with the phase variation, and hence the transmitted-light intensity is varied. Thus, the ratio detected by the frequency variation detection means 22 is varied.

Figure 4:
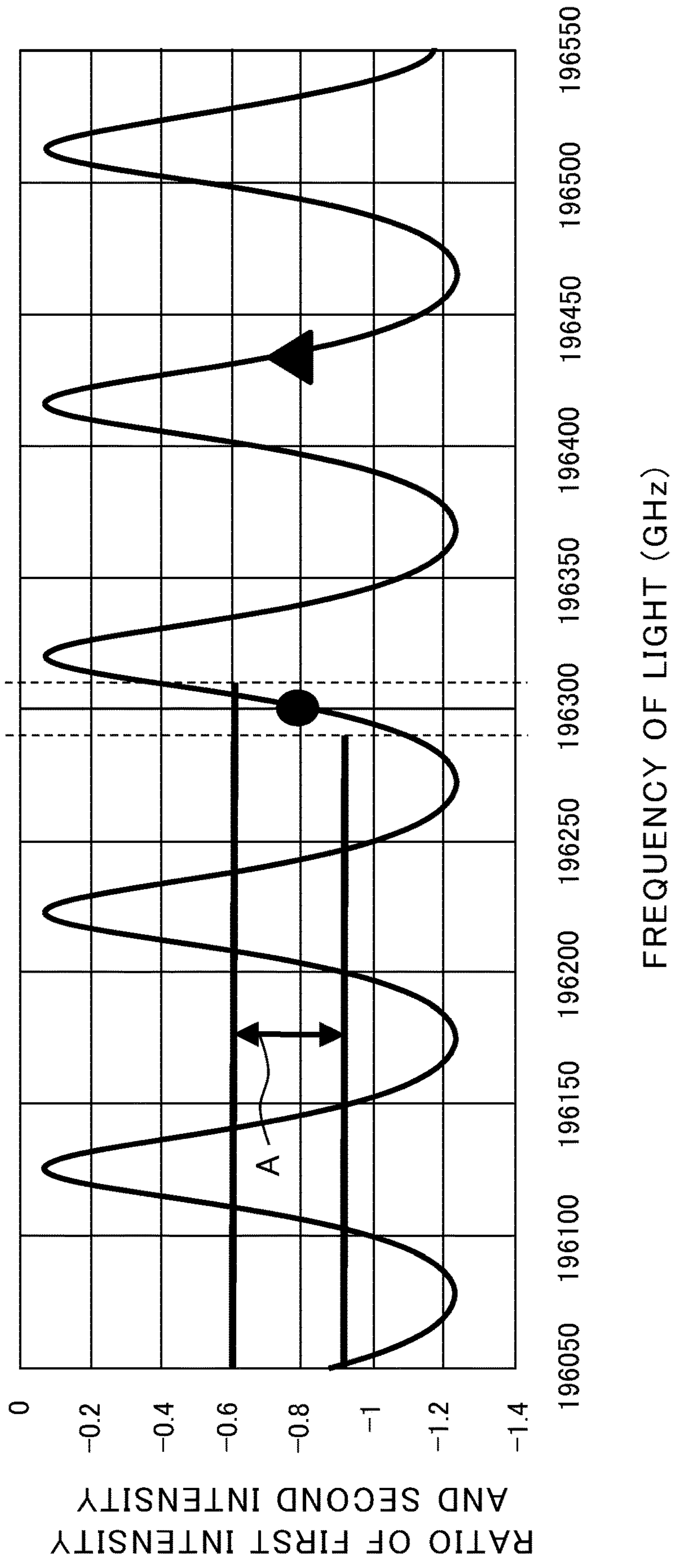
FIG. 4 is a diagram illustrating details of the optical module of the first example embodiment.

With reference to FIG. 4, the variation of the ratio is described. FIG. is a diagram illustrating a relationship between the ratio of the transmitted-light intensity and the output-light intensity and the frequency of the light output from the light source 11. The vertical axis in FIG. 4 indicates the ratio of the transmitted-light intensity and the output-light intensity. The horizontal axis in FIG. 4 indicates the frequency of the light. When the center frequency of the light output from the light source 11 is 196,300 GHz, the varying means 21 varies the parameter of the signal within the first range, as described above. With this, as the oscillation frequency, the variation is performed by approximately ±5 GHz with respect to the oscillation frequency during operation. In this manner, the varying means 21 continuously varies the ratio within a second range by continuously varying the parameter of the signal input to the light source within the first range. In FIG. 4, the second range is a range indicated with the arrow A. The first range may be reduced according to a required frequency accuracy. For example, reduction may be made to ±0.1 GHz. The second range may be a range narrower than the range indicated with the arrow A.

Further, the frequency variation detection means 22 also detects the plus or the minus of the inclination of the ratio between the transmitted-light intensity and the output-light intensity at the time of varying the parameter of the signal within the first range. The plus and the minus are associated with variation directions. As described above, when the parameter of the signal input to the light source 11 (the value of the phase power input to the phase control unit 113 described above) is varied, the ratio of the transmitted-light intensity and the output-light intensity is varied. In this state, the frequency variation detection means 22 stores the variation of the parameter and the variation of the ratio in association with each other.

In the following description, X μW and X μW+20 μW are values included in the first range. The varying means 21 increases the value of the phase power input to the phase control unit 113 from X μW to X μW+20 μW. It is assumed that, when the varying means 21 increases the phase power, the value of the ratio is increased. In this case, when the value of the phase power is varied from X μW to X μW+20 μW, the frequency variation detection means 22 stores that the ratio is varied in the positive direction.

Further, the varying means 21 reduces the value of the phase power input to the phase control unit 113 from X μW+20μ to X μW. It is assumed that, when the varying means 21 reduces the phase power, the value of the ratio is reduced. In this case, the frequency variation detection means 22 stores that the ratio is varied in the negative direction at the time of varying the value of the phase power from X μW+20μ to X μW.

In the description given above, it is assumed that X μW and X μW+20 μW are included in the first range, but X μW−10 μW and X μW+10 μW may be included in the first range. Further, for example, X may be a phase power value at the time of maximizing the intensity of the light output from the light source 11. Further, when the value of X is varied, the first range may be varied according to the variation of the value of X. Specifically, when X is varied to Y in the example given above, the first range is varied in such a way to include Y μW and Y μW+20 μW.

As described above, when the varying means 21 varies the parameter of the signal within the first range, the ratio is varied within the second range as indicated with the arrow A in FIG. 4. The frequency variation detection means 22 stores whether the ratio is varied in the positive direction or the negative direction for each time the parameter is varied within the first range. The frequency variation detection means 22 stores the directions stored herein as a first direction. The variation direction of the ratio associated with the variation of the parameter may be provided in advance.

In this manner, the varying means 21 varies the ratio of the transmitted-light intensity and the output-light intensity in the first direction being the positive direction or the negative direction by varying the parameter of the signal input to the light source 11 from a first value to a second value.

Next, description is made on processing of detecting deviation of the oscillation frequency by the frequency variation detection means 22. The frequency variation detection means 22 monitors the ratio of the transmitted-light intensity and the output-light intensity, and estimates the oscillation frequency based on deviation from the value of the ratio (0.8) associated with the oscillation frequency of 196.300 GHz. Further, when the value of the ratio exceeds a frequency range that is set in advance, an alarm is issued as an oscillation frequency error. In a case in which the value of the ratio is suppressed from −0.6 to −0.9 as the specifications of the oscillation frequency, when the detected value of the ratio is, for example, −1.2, the frequency variation detection means 22 issues an alarm because the frequency of the light output from the light source 11 is largely deviated. In other words, when it is detected that the ratio is varied outside the second range, the frequency variation detection means detects deviation of the frequency of the light output from the light source 11.

Next, description is made on processing of detecting a frequency variation by the frequency variation detection means 22. In a case in which the varying means 21 varies the parameter of the signal from the first value to the second value, when it is detected that the ratio is varied in a second direction opposite to the first direction, the frequency variation detection means 22 issues an alarm indicating that the oscillation frequency is shifted to a frequency that is significantly different from the setting.

As in the example given above, for example, when the value of the phase power is varied from X μW to X μM+20 μW, the frequency variation detection means 22 stores that the ratio is varied in the positive direction. Further, the frequency variation detection means 22 stores the positive direction as the first direction. After that, when the frequency variation detection means 22 detects that the variation direction of the ratio at the time of varying the value of the phase power from X μW to X μW+20 μW is the negative direction, the frequency variation detection means 22 detects the frequency variation of the light output from the light source 11.

The frequency variable laser such as the light source 11 is required to operate in a wide frequency range, and hence the oscillation frequency is largely varied due to a slight disturbance of the control parameter relating to the oscillation frequency. When such a frequency variation is caused, the frequency of the light output from the light source 11 is varied from the frequency (approximately 196,300 GHz) associated with the circle in FIG. 4 to the frequency (196,435 GHz) indicated with the triangle in some cases. Even when such a variation of the frequency is caused, the value of the ratio is within the second range, and hence it is difficult to detect such a frequency variation based on only the value of the ratio. In contrast, the frequency variation detection means 22 of the optical module 1 uses the variation direction of the ratio, and hence is capable of detecting the frequency variation even in the case described above.

In a case of a large frequency variation as described above, a user can specify a highly possible variation amount in advance in some cases. In such a case, a user may design the band filter 13 in such a way that the variation direction of the ratio at the frequency shifted from the center frequency by the variation amount that can be specified in advance is opposite to the ratio at the center frequency.

Specifically, it is assumed that a user specifies, in advance, that the frequency is easily varied by 135 GHz. In such a case, a user may design the band filter 13 in such a way that the variation direction of the ratio at 196,435 GHz shifted from 196,300 GHz being the center frequency by 135 GHz is opposite to the variation direction of the ratio at 196,300 GHz, as illustrated in FIG. 4.

Further, when the variation amount of the transmitted-light intensity with respect to the variation of the power input to the phase control unit is equal to or less than a predetermined threshold value, the frequency variation detection means 22 may not be configured to detect the frequency variation of the light. For example, as described above, it is assumed that the varying means 21 varies the phase power input to the phase control unit 113 by 20 μW. In this case, the varying means 21 varies the value of the phase power from X μW to X μW+20 μW. In a case in which the phase power is varied as described above, and the variation amount of the transmitted-light intensity is equal to or less than the threshold value (for example, 2 mW), even when it is detected that the ratio is varied in the second direction being a direction opposite to the first direction, the frequency variation detection means 22 does not detect the frequency variation of the light.

In a case in which the frequency variation detection means 22 detects the frequency variation by using the variation direction of the ratio, when the transmitted-light intensity is excessively low, the variation direction of the ratio may be both the positive direction and the negative direction due to a slight error. Thus, in order to securely detect the frequency variation by using the variation direction of the ratio, the transmitted-light intensity is required to be high to a certain extent. Thus, even in a case in which the variation direction of the ratio is varied from the first direction to the second direction, when the transmitted-light intensity is less than the threshold value, the frequency variation detection means 22 of the optical module 1 does not detect the frequency variation of the light. With this, the optical module 1 is capable of suppressing erroneous detection of the frequency variation.

In the description given above, it is described that the parameter of the signal that is varied by the varying means 21 is the value of the phase power input to the phase control unit 113 described above. However, the parameter of the signal is only required to vary the ratio of the transmitted-light intensity detected by the transmitted-light detection means 14 and the output-light intensity detected by the output-light detection means 16. Thus, the parameter of the signal may be other than the value of the phase power.

Figure 5:
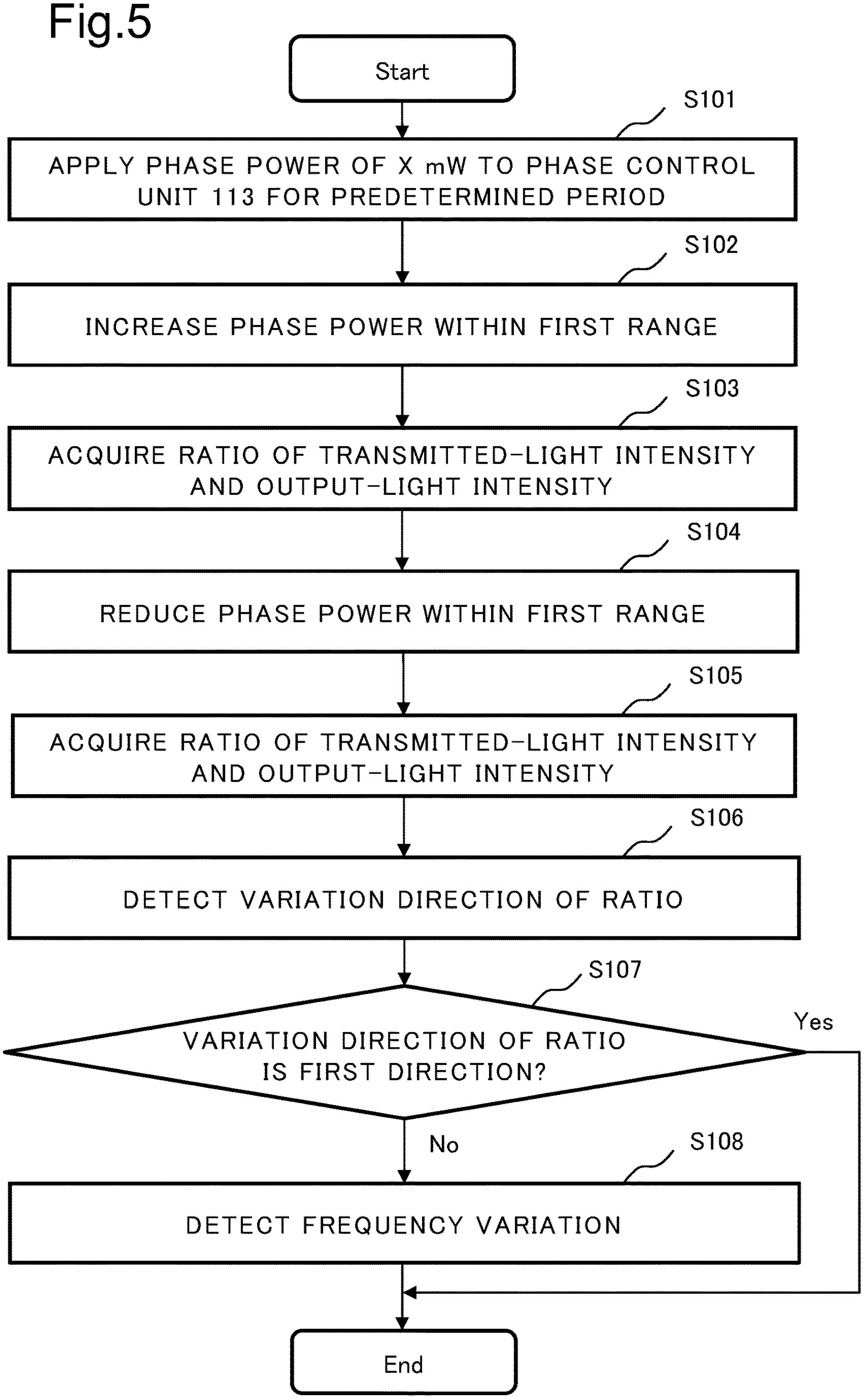
FIG. 5 is a flowchart illustrating an operation example of the optical module of the first example embodiment.

Next, with reference to FIG. 5, a frequency variation detection method by the optical module 1 is described. FIG. 5 is a flowchart illustrating processing by the optical module 1. A frequency variation detection program may cause an information processing device to execute the processing illustrated in the flowchart.

The varying means 21 applies the phase power of X mW to the phase control unit 113 for a predetermined period (S101). With this, the intensity of the light output from the light source 11 is maximized. The phase power of X mW may be applied from a configuration other than the varying means 21. The predetermined period is 10 seconds, for example.

After the predetermined period elapses, the varying means 21 increases the phase power within the first range (S102). For example, the varying means 21 increases the phase power from X μW to X+20 μW. After the processing in S102, the frequency variation detection means 22 detects the ratio of the transmitted-light intensity and the output-light intensity (S103). Specifically, the frequency variation detection means 22 acquires the ratio based on the transmitted-light intensity and the output-light intensity that are detected by the transmitted-light detection means 14 and the output-light detection means 16.

The varying means 21 reduces the phase power within the first range (S104). For example, the varying means 21 reduces the phase power from X μW+20 μW to X−20 μW. After the processing in S104, the frequency variation detection means 22 detects the ratio of the transmitted-light intensity and the output-light intensity (S105).

The frequency variation detection means 22 detects the variation direction of the ratio (S106). Specifically, the frequency variation detection means 22 compares the ratio detected in S103 and the ratio detected in S105, and detects increase or reduction. The increase of the ratio is associated with the variation of the ratio in the positive direction. Further, the reduction of the ratio is associated with the variation of the ratio in the negative direction.

The frequency variation detection means 22 determines whether the variation direction of the ratio is the first direction (S107). It is assumed that the first direction is stored in advance in a memory, which is not depicted. When it is determined that the variation direction of the ratio is the first direction (Yes in S107), the frequency variation detection means 22 terminates the operation. The optical module 1 may execute the processing in S101 again.

When it is not determined that the variation direction of the ratio is the first direction (No in S107), the frequency variation detection means 22 detects the frequency variation of the light output from the light source 11 (S108). In the processing in S107, when the variation direction of the ratio is not the first direction, the variation direction of the ratio is the second direction. The frequency variation detected in S108 is due to the shifting of oscillation frequency to the frequency that is significantly different from the setting. Although not clearly described in the present flowchart, the frequency variation detection means 22 may further issue an alarm indicating significant deviation of the frequency of the light when the value of the ratio exceeds the second range. As described above, the case in which the value of the ratio exceeds the second range is associated with the case in which the value of the ratio exceeds the frequency range that is set in advance.

As described above, the optical module 1 includes the light source 11, the first splitting means 12, the band filter 13, the transmitted-light detection means 14, the second splitting means 15, the output-light detection means 16, the varying means 21, and the frequency variation detection means 22.

The light source 11 outputs light. The first splitting means 12 splits the light output from the light source 11. The band filter 13 transmits the one piece of the light split by the first splitting means with periodic frequency characteristics. The transmitted-light detection means detects the transmitted-light intensity being the intensity of the transmitted light which is the light transmitted through the band filter 13. The second splitting means 15 splits the other part of the light split by the first splitting means 12. The output-light detection means 16 detects the output-light intensity being the intensity of the output light which is the one piece of the light split by the second splitting means 15.

The varying means 21 varies the ratio of the transmitted-light intensity and the output-light intensity in the first direction being the positive direction or the negative direction by varying the parameter of the signal input to the light source 11 from the first value to the second value. In a case in which the varying means 21 varies the parameter from the first value to the second value, when it is detected that the ratio is varied in the second direction being a direction opposite to the first direction, the frequency variation detection means 22 detects the frequency variation of the light output from the light source 11.

The frequency variable laser such as the light source 11 is required to operate in a wide frequency range, and hence the oscillation frequency is largely varied due to a slight disturbance of the control parameter relating to the oscillation frequency. When such a frequency variation is caused, the frequency of the light output from the light source 11 is varied from the frequency (approximately 196,300 GHz) associated with the circle in FIG. to the frequency (196,335 GHz) indicated with the triangle in some cases. Even when such a variation of the frequency is caused, the value of the ratio is within the second range, and hence it is difficult to detect such a frequency variation based on only the value of the ratio. In contrast, the frequency variation detection means 22 of the optical module 1 uses the variation direction of the ratio, and hence is capable of detecting the frequency variation even in the case described above. Therefore, the optical module 1 is capable of detecting a frequency variation at a higher accuracy.

In the optical module 1 described above, the light source 11, the first splitting means 12, the band filter 13, the transmitted-light detection means 14, the second splitting means 15, the output-light detection means 16, and the control means 20 are integrally provided. However, those are not required to be provided integrally. For example, the optical module 1 may be a frequency variation detection system to which only the control means 20 is provided as a separate body.

Figure 6:
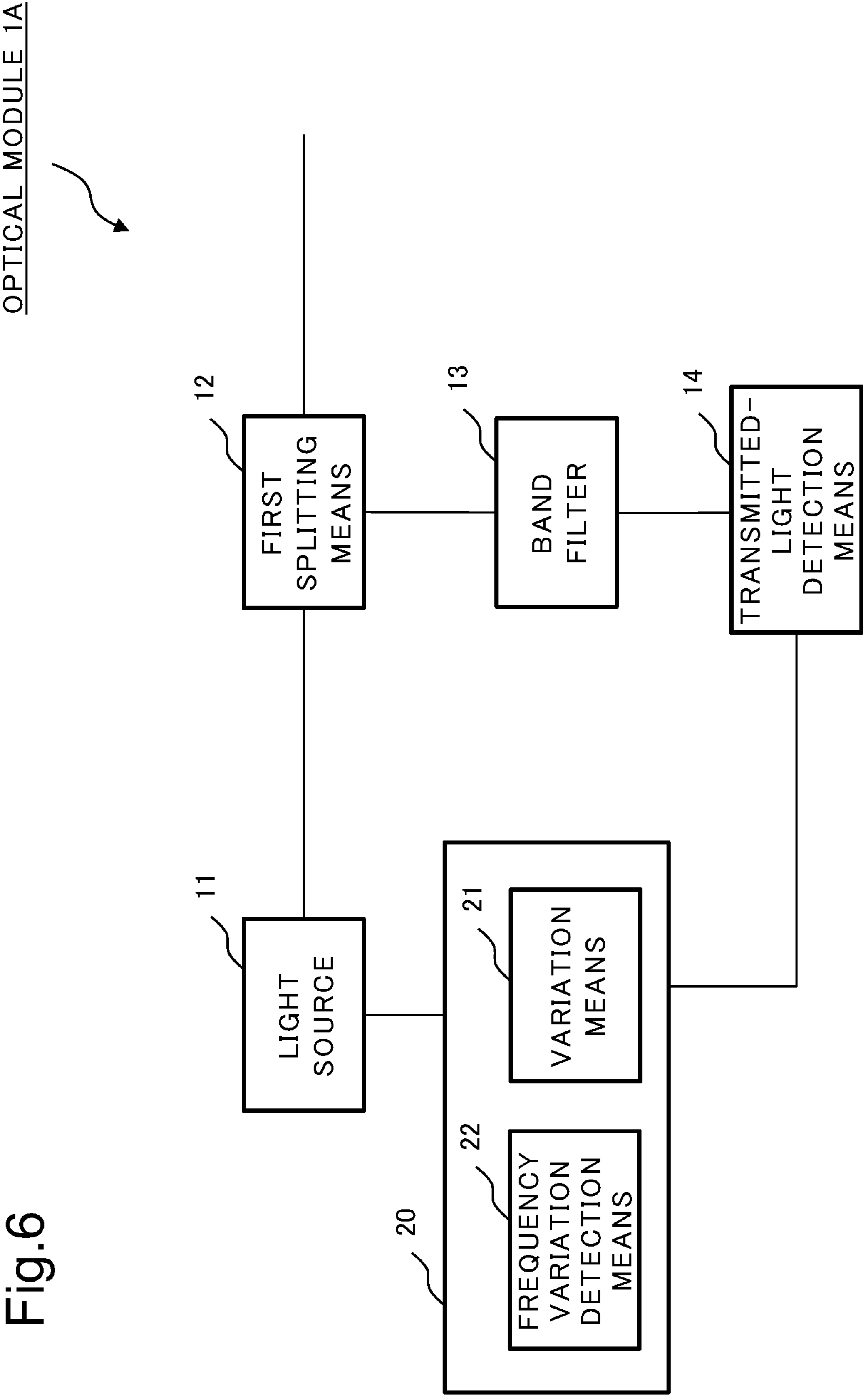
FIG. 6 is a block diagram illustrating a configuration example in a modification example of the first example embodiment.

Next, with reference to FIG. 6, an optical module 1A is described. The optical module 1A is a modification example of the optical module 1. As illustrated in FIG. 1, the optical module 1A includes the light source 11, the first splitting means 12, the band filter 13, the transmitted-light detection means 14, and the control means 20. The optical module 1A is different from the optical module 1 in that the second splitting means 15 and the output-light detection means 16 are not included.

In the optical module 1A, the varying means 21 varies the transmitted-light intensity, instead of the ratio of the transmitted-light intensity and the output-light intensity, in the first direction being the positive direction or the negative direction, by varying the parameter of the signal input to the light source 11 from the first value to the second value.

Further, in the optical module 1A, in a case in which the varying means 21 varies the parameter from the first value to the second value, when it is detected that the transmitted-light intensity is varied in the second direction being a direction opposite to the first direction, the frequency variation detection means 22 detects the frequency variation of the light output from the light source 11.

Figure 7:
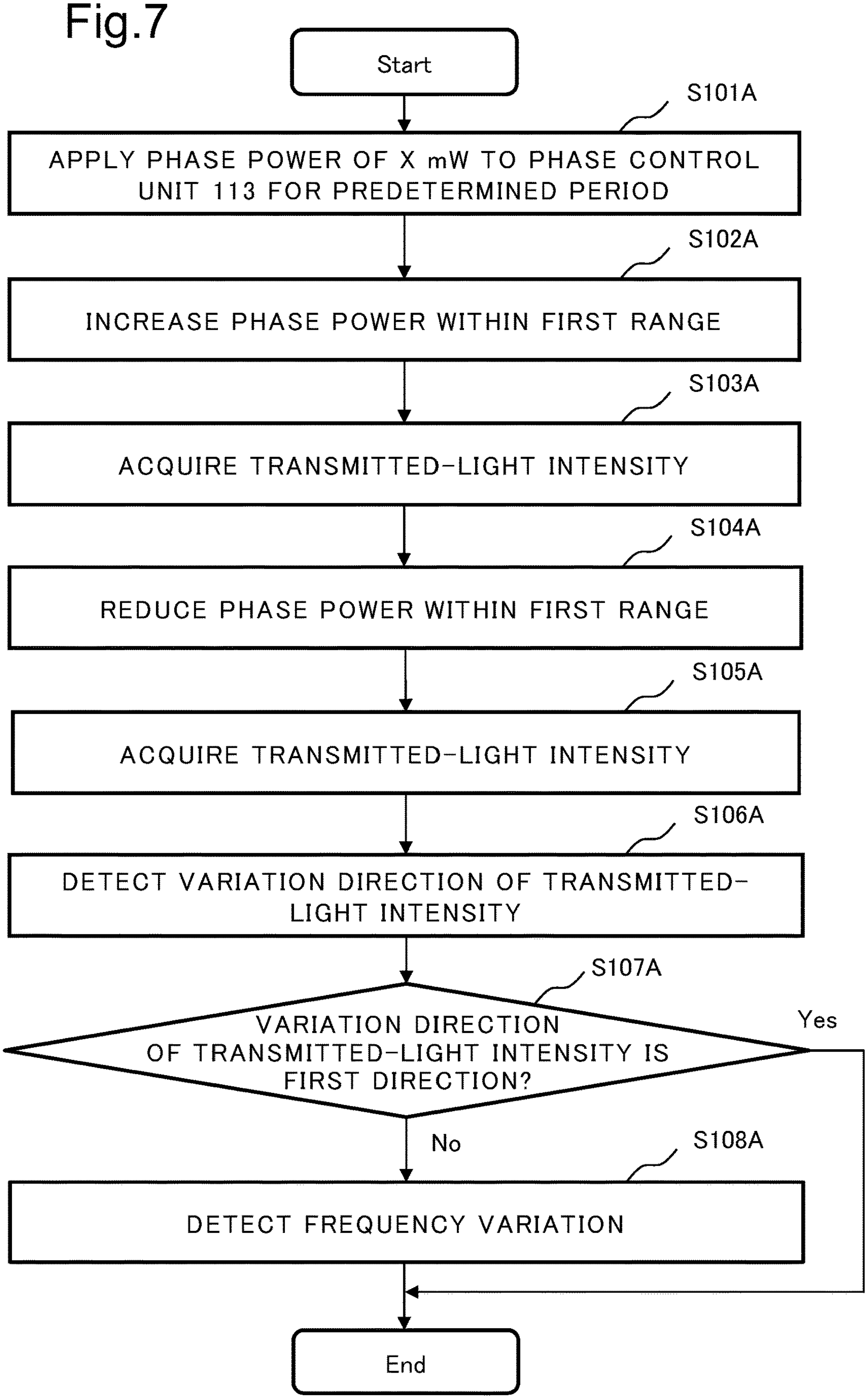
FIG. 7 is a flowchart illustrating an operation example in the modification example of the first example embodiment.

Next, with reference to FIG. 7, processing by the optical module 1A is described. FIG. 7 is a flowchart illustrating processing by the optical module 1. A frequency variation detection program may cause an information processing device to execute the processing illustrated in the flowchart.

The varying means 21 applies the phase power of X mW to the phase control unit 113 for a predetermined period (S101A). With this, the intensity of the light output from the light source 11 is maximized. The phase power of X mW may be applied from a configuration other than the varying means 21. The predetermined period is 10 seconds, for example.

After the predetermined period elapses, the varying means 21 increases the phase power within the first range (S102A). For example, the varying means 21 increases the phase power from X μW to X+20 μW. After the processing in S102, the frequency variation detection means 22 detects the transmitted-light intensity (S103A). Specifically, the frequency variation detection means 22 acquires the transmitted-light intensity detected by the transmitted-light detection means 14.

The varying means 21 reduces the phase power within the first range (S104A). For example, the varying means 21 reduces the phase power from X μW+20 μW to X−20 μW.

After the processing in S104A, the frequency variation detection means 22 detects the transmitted-light intensity (S105A).

The frequency variation detection means 22 detects the variation direction of the transmitted-light intensity (S106A). Specifically, the frequency variation detection means 22 compares the transmitted-light intensity detected in S103A and the transmitted-light intensity detected in S105A, and detects increase or reduction. The increase of the transmitted-light intensity is associated with the variation of the transmitted-light intensity in the positive direction. Further, the reduction of the transmitted-light intensity is associated with the variation of the transmitted-light intensity in the negative direction.

The frequency variation detection means 22 determines whether the variation direction of the transmitted-light intensity is the first direction (S107A). It is assumed that the first direction is stored in advance in a memory, which is not depicted. When it is determined that the variation direction of the transmitted-light intensity is the first direction (Yes in S107A), the frequency variation detection means 22 terminates the operation. In this case, the optical module 1A may execute the processing in S101A again.

When it is not determined that the variation direction of the transmitted-light intensity is the first direction (No in S107A), the frequency variation detection means 22 detects the frequency variation of the light output from the light source 11 (S108A). In the processing in S107A, when the variation direction of the transmitted-light intensity is not the first direction, the variation direction of the transmitted-light intensity is the second direction. The frequency variation detected in S108A is due to the oscillation frequency shifted to the frequency that is significantly different from the setting. Although not clearly described in the present flowchart, the frequency variation detection means 22 may further issue an alarm indicating significant deviation of the frequency of the light when the value of the transmitted-light intensity exceeds the second range. The case in which the value of the transmitted-light intensity exceeds the second range is associated with the case in which the value of the transmitted-light intensity exceeds the frequency range that is set in advance, as described above.

As described above, the optical module 1A includes the light source 11, the first splitting means 12, the band filter 13, the transmitted-light detection means 14, the varying means 21, and the frequency variation detection means 22.

Further, the varying means 21 varies the transmitted-light intensity instead of the ratio, in the first direction being the positive direction or the negative direction, by varying the parameter of the signal input to the light source 11 from the first value to the second value. In a case in which the varying means 21 varies the parameter from the first value to the second value, when it is detected that the transmitted-light intensity is varied in the second direction being a direction opposite to the first direction, the frequency variation detection means 22 detects the frequency variation of the light output from the light source 11.

The frequency variable laser such as the light source 11 is required to operate in a wide frequency range, and hence the oscillation frequency is largely varied due to a slight disturbance of the control parameter relating to the oscillation frequency. When such a frequency variation is caused, the value of the intensity of the light is not varied in some cases, and in such a case, it is difficult to detect the frequency variation based on only the value of the intensity of the light. In contrast, the frequency variation detection means 22 of the optical module 1A uses the variation direction of the intensity of the transmitted light, and hence the frequency variation can be detected even in the case described above. Therefore, the optical module 1A is capable of detecting a frequency variation at a higher accuracy.

Second Example Embodiment

Figure 8:
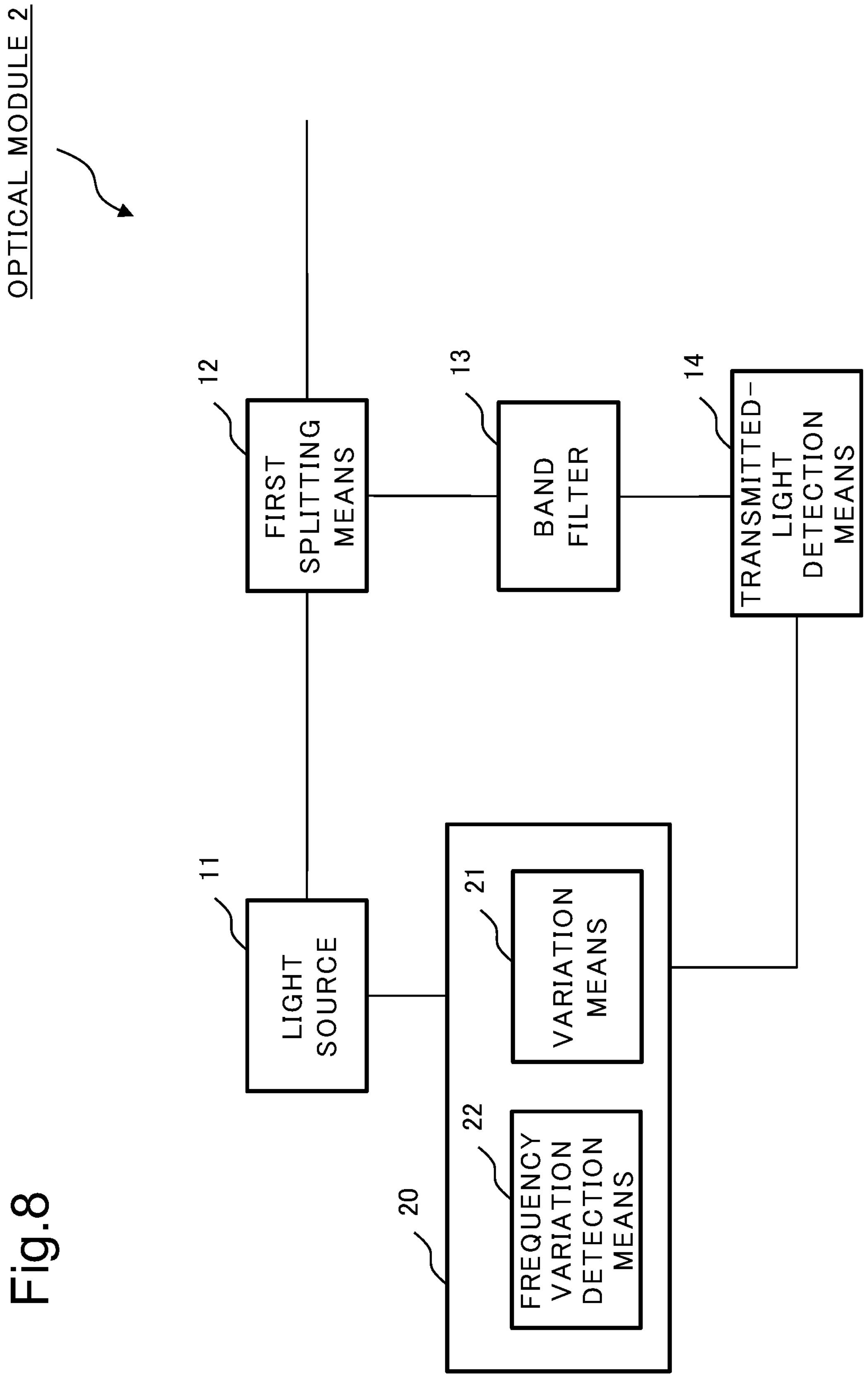
FIG. 8 is a block diagram illustrating a configuration example of an optical module of a second example embodiment.

With reference to FIG. 8, an optical module 2 of a second example embodiment is described. FIG. 8 is an exemplary block diagram illustrating a configuration of the optical module 2.

The configuration of the optical module 2 is described. As illustrated in FIG. 8, the optical module 2 includes the light source 11, the first splitting means 12, the band filter 13, the transmitted-light detection means 14, and the control means 20. The control means 20 includes the varying means 21 and the frequency variation detection means 22.

The light source 11 outputs light. The first splitting means 12 splits the light output from the light source 11. The band filter 13 transmits the one piece of the light split by the first splitting means 12 with periodic frequency characteristics. The transmitted-light detection means detects the transmitted-light intensity being the intensity of the transmitted light which is the light transmitted through the band filter 13.

The varying means 21 varies the transmitted-light intensity in the first direction being the positive direction or the negative direction by varying the parameter of the signal input to the light source 11 from the first value to the second value. In a case in which the varying means 21 varies the parameter from the first value to the second value, when it is detected that the transmitted-light intensity is varied in the second direction being a direction opposite to the first direction, the frequency variation detection means 22 detects the frequency variation of the light output from the light source 11.

Figure 9:
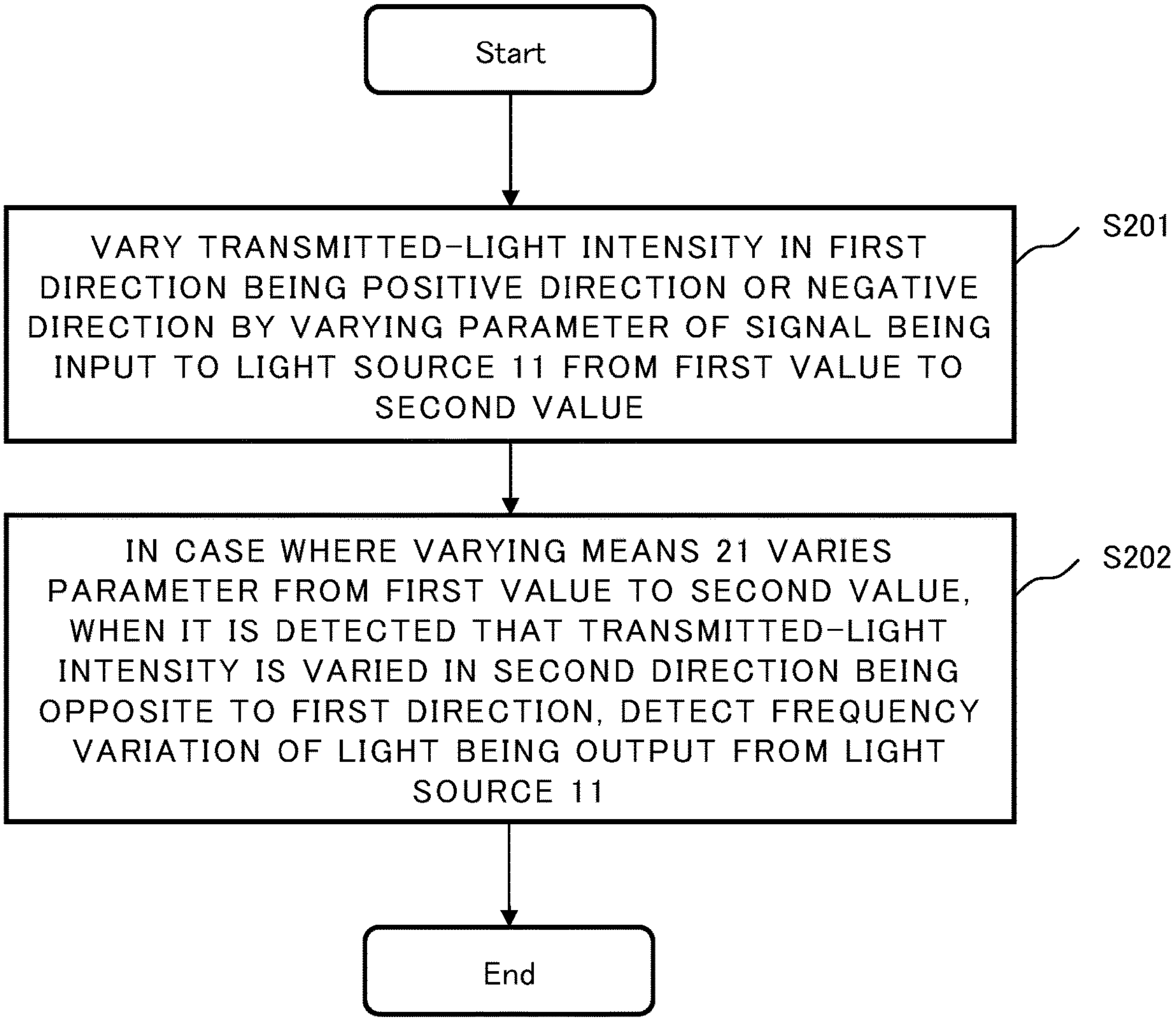
FIG. 9 is a flowchart illustrating an operation example of the optical module of the second example embodiment.
Figure 10:
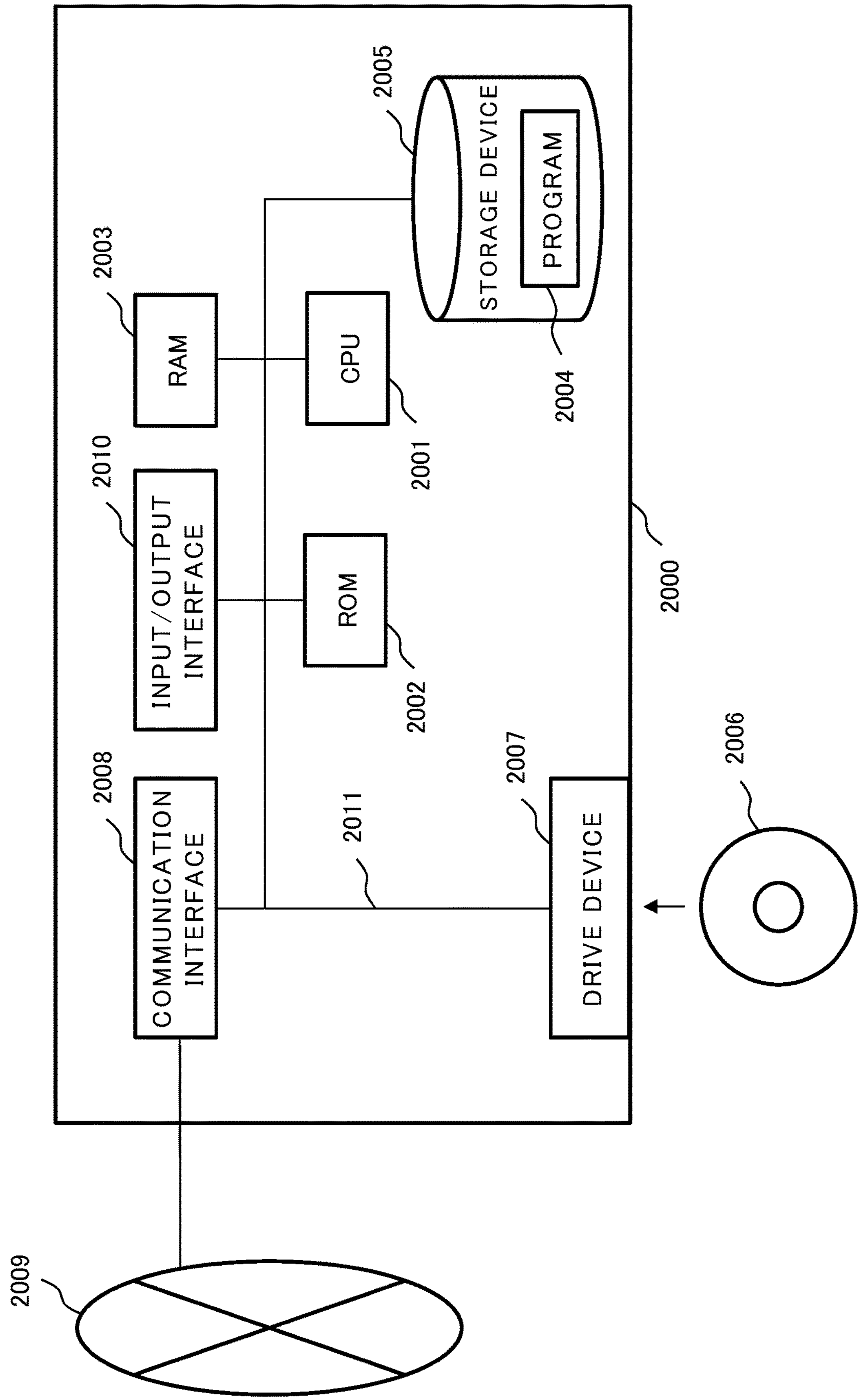
Figure 11:
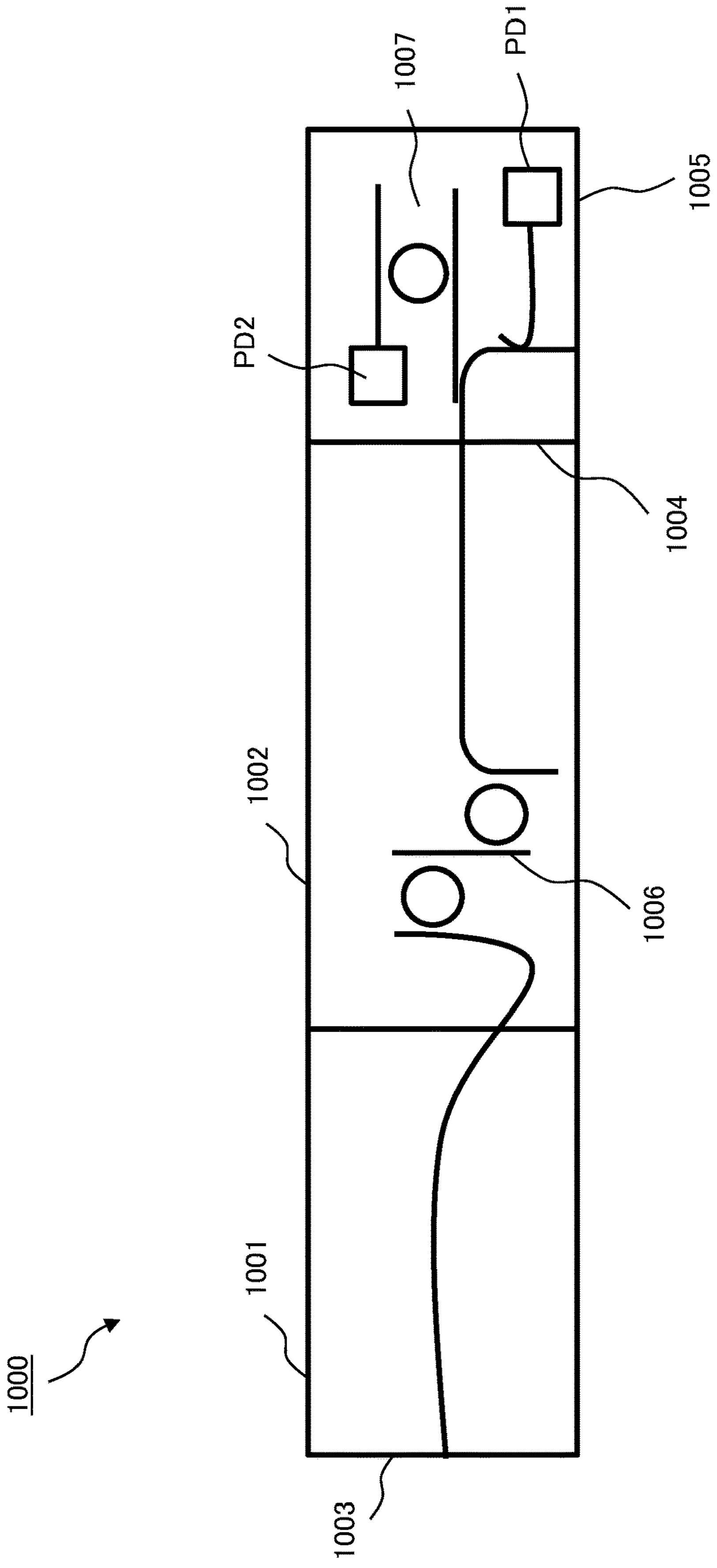
FIG. 11 is a diagram for describing a background art.
Figure 12:
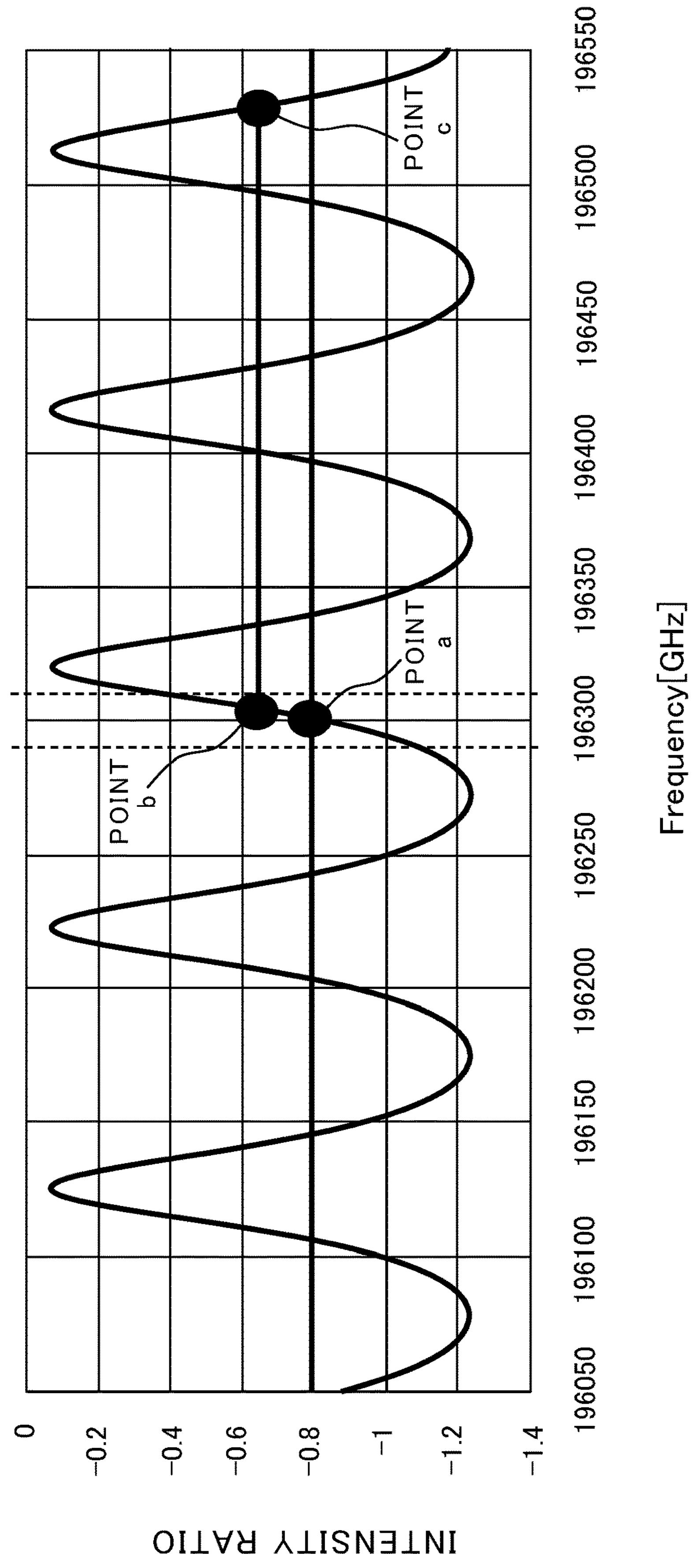
FIG. 12 is a diagram for describing the background art.

Next, with reference to FIG. 9, an operation of the optical module 2 is described. FIG. 9 is a flowchart illustrating a frequency variation detection method by the optical module 2. A frequency variation detection program may cause an information processing device to execute the processing illustrated in the flowchart.

The varying means 21 varies the transmitted-light intensity in the first direction being the positive direction or the negative direction by varying the parameter of the signal input to the light source 11 from the first value to the second value (S201). In a case in which the varying means 21 varies the parameter from the first value to the second value, when it is detected that the transmitted-light intensity is varied in the second direction being a direction opposite to the first direction, the frequency variation detection means 22 detects the frequency variation of the light output from the light source 11 (S202).

As described above, the optical module 2 includes the light source 11, the first splitting means 12, the band filter 13, the transmitted-light detection means 14, the varying means 21, and the frequency variation detection means 22.

The varying means 21 varies the transmitted-light intensity in the first direction being the positive direction or the negative direction by varying the parameter of the signal input to the light source 11 from the first value to the second value. In a case in which the varying means 21 varies the parameter from the first value to the second value, when it is detected that the transmitted-light intensity is varied in the second direction being a direction opposite to the first direction, the frequency variation detection means 22 detects the frequency variation of the light output from the light source 11.

The frequency variable laser such as the light source 11 is required to operate in a wide frequency range, and hence the oscillation frequency is largely varied due to a slight disturbance of the control parameter relating to the oscillation frequency. When such a frequency variation is caused, the value of the intensity of the light is not varied in some cases, and in such a case, it is difficult to detect the frequency variation based on only the value of the intensity of the light in such a case. In contrast, the frequency variation detection means 22 of the optical module 2 uses the variation direction of the intensity of the transmitted light, and hence the frequency variation can be detected even in the case described above. Therefore, the optical module 2 is capable of detecting a frequency variation at a higher accuracy.

Further, some or all of the components of each of the devices or the system are achieved by any combination of an information processing device 2000 and a program, as illustrated in FIG. 9, for example. FIG. 9 is a diagram illustrating an example of an information processing device for achieving the optical modules 1 and 2, and the like. As an example, the information processing device 2000 includes the following configuration.

A central processing unit (CPU) 2001

A read only memory (ROM) 2002

A random access memory (RAM) 2003

A program 2004 loaded on the RAM 2003

A storage device 2005 that stores the program 2004

A drive device 2007 that performs writing and reading of a recording medium 2006

A communication interface 2008 that is connected to a communication network 2009

An input/output interface 2010 that inputs and outputs data

A bus 2011 that connects each component

Each of the components of each of the devices in each of the example embodiments is achieved by the CPU 2001 acquiring and executing the program 2004 for achieving those functions. For example, the program for achieving functions of the components of each of the devices is stored in the storage device 2005 or the RAM 2003 in advance, and is read out by the CPU 2001, as required. The program 2004 may be supplied to the CPU 2001 via the communication network 2009, or may be stored in advance in the recording medium 2006, and may be supplied to the CPU by the drive device 2007 reading out the program.

Various modification examples are given as a method of achieving each of the devices. For example, each of the devices may be achieved by any combinations of a program and the information processing device 2000, each of which is separately provided for each of the components. Further, a plurality of components to be included in each of the devices may be achieved by any one combination of a program and the information processing device 2000.

Further, a part or an entirety of each of the components of each of the devices is achieved by a general or dedicated circuitry including a processor or the like, or by a combination thereof. These may be configured by a single chip or a plurality of chips connected to each other via a bus. A part or an entirety of each of the components of each of the devices may be achieved by a combination of the circuitry or the like described above and a program.

When a part or an entirety of each of the components of each of the devices is achieved by a plurality of information processing devices, circuitries, and the like, the plurality of information processing devices, the circuitries, and the like may be arranged in a centralized way, or may be arranged in a distributed way. For example, the information processing devices, the circuitries, and the like may be achieved in a form in which each of the information processing devices, the circuitries, and the like is connected via a communication network, such as a client-and-server system and a cloud computing system.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. An optical module comprising:

a light source configured to output light;

a first splitter configured to split the light;

a band filter configured to transmit one piece of light being split by the first splitter with a periodic frequency characteristic;

a transmitted-light detector configured to detect transmitted-light intensity being intensity of transmitted light being light transmitted through the band filter;

a variation device configured to vary the transmitted-light intensity in a first direction being a positive direction or a negative direction, by varying a parameter of a signal being input to the light source from a first value to a second value; and a frequency variation detection device configured to detect a frequency variation of the light being output from the light source, when a variation of the transmitted-light intensity in a second direction being opposite to the first direction is detected, in a case where the variation device varies the parameter from the first value to the second value.

2. The optical module according to claim 1, further comprising:

a second splitter configured to split another piece of light being split by the first splitter; and an output-light detector configured to detect output-light intensity being intensity of output light being one piece of light being split by the second splitter, wherein the variation device varies a ratio between the output-light intensity and the transmitted-light intensity, in place of the transmitted-light intensity, in a first direction being a positive direction or a negative direction, by varying the parameter of a signal being input to the light source from the first value to the second value, and the frequency variation detection device detects a frequency variation of the light being output from the light source, when a variation of the ratio in a second direction being opposite to the first direction is detected, in a case where the variation device varies the parameter from the first value to the second value.

3. The optical module according to claim 2, wherein the variation device continuously varies the ratio within a second range by continuously varying the parameter of the signal being input to the light source within a first range including the first value and the second value.

4. The optical module according to claim 3, wherein, when a variation of the ratio outside the second range is detected, the frequency variation detection device detects deviation of a frequency of the light being output from the light source.

5. The optical module according to claim 1, wherein the parameter of the signal being input to the light source is power of an electric signal being input to the light source, and a phase of the light is varied due to the power.

6. The optical module according to claim 2, wherein the parameter of the signal being input to the light source is power of an electric signal being input to the light source, and a phase of the light is varied due to the power.

7. The optical module according to claim 5, wherein, when a variation amount of the transmitted-light intensity with respect to a variation of the power is equal to or less than a predetermined threshold value, the frequency variation detection device does not detect the frequency variation of the light.

8. The optical module according to claim 6, wherein, when a variation amount of the transmitted-light intensity with respect to a variation of the power is equal to or less than a predetermined threshold value, the frequency variation detection device does not detect the frequency variation of the light.

9. A frequency variation detection method in an optical module including a light source configured to output light, a first splitter configured to split the light, a band filter configured to transmit one piece of light being split by the first splitter with a periodic frequency characteristic, and a transmitted-light detector configured to detect transmitted-light intensity being intensity of transmitted light being light transmitted through the band filter, the frequency variation detection method comprising:

varying the transmitted-light intensity in a first direction being a positive direction or a negative direction, by varying a parameter of a signal being input to the light source from a first value to a second value; and detecting a frequency variation of the light being output from the light source, when detecting a variation of the transmitted-light intensity in a second direction being opposite to the first direction, in a case of varying the parameter from the first value to the second value.

10. A non-transitory computer-readable storage medium configured to store a frequency variation detection program in an optical module including a light source configured to output light, a first splitter configured to split the light, a band filter configured to transmit one piece of light being split by the first splitter with a periodic frequency characteristic, and a transmitted-light detection device configured to detect transmitted-light intensity being intensity of transmitted light being light transmitted through the band filter, the frequency variation detection program causing an information processing device to execute:

processing of varying the transmitted-light intensity in a first direction being a positive direction or a negative direction, by varying a parameter of a signal being input to the light source from a first value to a second value; and processing of detecting a frequency variation of the light being output from the light source, when detecting a variation of the transmitted-light intensity in a second direction being opposite to the first direction, in a case of varying the parameter from the first value to the second value.

* * * * *